United States Patent [19]
Courtright et al.

[11] Patent Number: 5,998,003
[45] Date of Patent: Dec. 7, 1999

[54] MULTILAYER NANOSTRUCTURED CERAMIC THERMAL BARRIER COATINGS

[75] Inventors: Edward L. Courtright, Grandview; Roger N. Johnson, Richland, both of Wash.; Wate T. Bakker, Saratoga, Calif.

[73] Assignee: Electric Power Research Institute, Inc., Palo Alto, Calif.

[21] Appl. No.: 09/151,411

[22] Filed: Sep. 10, 1998

[51] Int. Cl.$^6$ ..................................................... B32B 18/00
[52] U.S. Cl. .......................... 428/216; 428/336; 428/701; 428/702
[58] Field of Search ..................................... 428/472, 699, 428/701, 702, 469, 216, 212, 336

[56] References Cited

U.S. PATENT DOCUMENTS 5,284,658  2/1994  Marshall et al. .......................... 428/216
5,789,071  8/1998  Sproul et al. .......................... 428/216

*Primary Examiner*—Archene Turner
*Attorney, Agent, or Firm*—William S. Glliani; Pennie & Edmonds LLP

[57] ABSTRACT

A thermal barrier coating has several different layers, the first of which is an oxidation barrier. A phonon scattering zone is positioned on top of the oxidation barrier. The phonon scattering zone includes a plurality of phonon scattering interface layers, each of which is formed between a first ceramic material and a second ceramic material. The first and second ceramic materials are each between 1 and 1000 nanometers thick. An optical reflectance zone is positioned on the phonon scattering zone. The optical reflectance zone includes a second stack of ceramic materials with a plurality of optically reflecting interface layers, each of which is formed between a first ceramic material and a second ceramic material. The first and second ceramic materials are each between 0.1 and 1.0 microns thick.

7 Claims, 3 Drawing Sheets

MULTILAYER NANOSTRUCTURED CERAMIC THERMAL BARRIER COATINGS

BRIEF DESCRIPTION OF THE INVENTION

This invention relates generally to ceramic and thermal barrier coating systems or the protection of metal substrates. More particularly, the invention relates to multilayer, nanostructured, ceramic thermal barrier coating systems for the protection of metallic components, such as those used in gas turbine engines.

BACKGROUND OF THE INVENTION

It is well known that the power and efficiency of gas turbine engines increase with operating temperature. However, the ability of a gas turbine to operate at increasingly higher temperatures is limited by the ability of the turbine components, specifically the vanes, blades, and combustor liners, to withstand the heat, oxidation, and corrosion of the impinging hot gas stream. It is now customary to build turbine components out of nickel-base superalloys which exhibit very good high-temperature mechanical properties and stability. Improved performance is typically obtained by casting the component, e.g., blade or vane, with internal cooling channels that enables the metal to operate at a lower temperature, even when it is in direct contact with the hot combustion gases. Thin ceramic thermal barrier coatings can enhance performance by providing protection against oxidation and corrosion of the hot combustion gas stream. Insulative ceramic coatings can further improve turbine engine performance by reducing the heat transferred into cooled air foils, thereby reducing the requirements for cooling air, which constitutes a performance penalty. The durability of metallic superalloy turbine components is also enhanced by ceramic coatings because they minimize metal temperatures and reduce thermal stresses.

Unfortunately, contemporary thermal barrier coatings, produced by electron-beam evaporation or plasma spraying, have not proven to be very reliable and hence their properties have not been used to full design advantage. Instead, these coatings have been used primarily to extend life and provide a small measure of extra durability.

Contemporary ceramic thermal barrier coatings typically exhibit several layers of differing composition and properties in order to provide a combination of benefits. It is generally preferred to apply a bond coating of an intermetallic such as MCrAlY or PtAl to the metallic substrate before applying a thick, e.g., 125–250 $\mu$m ceramic overlay coating. The bond layer is typically preoxidized to form a protective aluminum oxide scale to resist the oxidizing effects of the hot combustion gas stream and to provide an adherent surface for the insulative ceramic thermal barrier. The ceramic thermal barrier coating, TBC, is usually composed of zirconium oxide alloyed with yttria, ceria, magnesia, calcia, or other additives, to help stabilize its composition against undesirable phase transformations, as well as to lower its intrinsic thermal conductivity. Although zirconia is a good insulator, it is highly permeable to oxygen and provides little or no protection against oxidation of the underlying metallic substrate. The passage of oxygen limits the service life of ceramic thermal barrier coating systems at high temperatures due to excessive growth of the aluminum-oxide scale that forms on the bond coating, which leads to the formation of stresses in the interfacial zone, which eventually cause spalling of the insulative layer. These degenerative conditions are enhanced by the severe thermal cycle exposure of the components, which must withstand very hot operating temperatures followed by periods of cooling to near room temperature. When this happens, the thermal expansion mismatch between the metal substrate and the coating introduce additional stresses at the interface, which are superimposed on top of the oxide growth stresses and further accelerate failure.

Consequently, improved, highly durable, ceramic thermal barriers are needed to withstand the rigorous conditions that exist within the combustion path of gas turbine engines. Further, it would be desirable to obtain the maximum performance benefits that thermal barriers offer.

In recent years attention has been directed towards controlling the arrangement of matter at the atomic or molecular scale. Scientists have now demonstrated that nanostructured materials exhibit unusual properties. For example, multilayered nanocomposites consisting of thousands of alternating strata, a few atoms to a few thousand atoms thick, have been shown to have strengths approaching theoretical limits (Steven Ashly, "Small-Scale Structures Yield Property Payoffs," Mechanical Engineering, No. 52, Feb. 19, 1994). While most of this work has been directed at metallic systems, it has been shown that nanolaminates enable the control of phase composition in zirconia thin film coatings (CR Aita, et al. "Sputter Deposited Zirconia-Alumina Nanolaminate Coatings," J. of Metals, October 1994). In addition, microlaminates of Ce—$ZrO_2$/$Al_2O_3$ have exhibited three times the toughness of the parent Ce—$ZrO_2$ material (D. B. Marshall, "Design of High-Toughness Laminar Zirconia Components," Ceramic Bulletin, Vol. 71, No. 6, 1992). In general, both toughness and strength are inversely proportional to layer thickness. Thus, coatings composed of thin nanoscale layers offer the optimum microstructure for structural applications.

While nanostructured materials may offer the potential to improve strength and toughness, it must be shown that thermal properties, e.g., thermal conductivity, are also enhanced and of significant value for thermal barrier applications. It is well established that alloy additions to pure zirconia introduce point defects into the lattice structure which scatter phonons and reduce thermal conductivity (P. J. Klemens, "Thermal Conductivity of Zirconia," Thermal Conductivity, 23, Technomics, Lancaster, Pa., 1996). It has also been shown that a reduction in grain size of yttria stabilized zirconia (YSZ) from one micron to five nanometers (50 angstroms) can theoretically yield a two-fold reduction in thermal conductivity (P. J. Klemens and M. Gell, "Thermal Conductivity of Thermal Barrier Coatings," TBC Workshop sponsored by TBC Interagency Coordinating Committee, 1997).

Multilayered laminates can also be designed in such a way as to reflect radiant energy. When energy enters a transparent medium of one index of refraction and then encounters a transparent medium of a different index of refraction, some of the energy will be transmitted through the discontinuity and some of it will be reflected from it. The reflectance from such an interface, defined as the ratio of the reflected intensity to the incident intensity, is a function of the difference in the indices of refraction between the two individual layers. Thus, an ensemble of thin alternating layers can be designed so that a significant fraction of the input radiant thermal energy will be reflected away. It has also been shown that the turbine blade wall temperature for blades exposed to radiation can be significantly reduced if the ceramic thermal barrier coating is opaque to radiation (R. Siegel and C. M. Spluckler, "Analysis of Thermal Radiation Effects on Temperatures in Turbine Engine Thermal Barrier Coatings," TBC Workshop, Cincinnati, Ohio 1997).

Further improvements are needed to extend the useful life of thermal barrier coating systems and enable them to survive the increasingly severe operating conditions needed to obtain higher performance in gas turbine engines. It would be highly desirable to employ multiple nanoscale ceramic layers to scatter and reflect thermal energy and thereby enhance the performance of gas turbine engine components.

SUMMARY OF THE INVENTION

The thermal barrier coating of the invention includes an oxidation barrier. A phonon scattering zone is positioned on top of the oxidation barrier. The phonon scattering zone includes a plurality of phonon scattering interface layers, each of which is formed between a first ceramic material and a second ceramic material. The first and second ceramic materials are each between 1 and 1000 nanometers thick. An optical reflectance zone is positioned on the phonon scattering zone. The optical reflectance zone includes a second stack of ceramic materials with a plurality of optically reflecting interface layers, each of which is formed between a first ceramic material and a second ceramic material. The first and second ceramic materials are each between 0.1 and 1.0 microns thick.

The present invention improves upon the prior art of ceramic thermal barrier coatings by providing a novel nanoscaled multilayered coating system to improve the performance range of superalloy turbine components, such as blades and vanes. The design of the coating reduces thermal conductivity by scattering phonons at layer interfaces. The present invention demonstrates that the physical principles involved in scattering phonons by nanoscale grain boundaries can be optimized in multilayered laminates of similar scale if the layers are oriented perpendicular to the direction of heat flow.

The multilayer coating also combines optical reflectance principles which utilize the change in index of refraction of the different ceramic layers in the multilayered structure, i.e., 2.1 for zirconia and 1.6 for alumina, to selectively reflect some of the incident radiant energy. The oxidation barrier provides improved performance if applied to an intermetallic bond layer, which has been preoxidized, or directly onto a preoxidized superalloy without a bond coat.

The coating is composed of multiple zones. A first zone operates as an oxidation barrier. The second, inner zone, or phonon scattering zone, constitutes one-half to two-thirds of the total thickness and is composed of alternating layers of alumina and zirconia, with thicknesses of each individual layer in a preferred range of 2 to 10 nanometers. This zone is then overlaid with a multilayer optical reflectance zone designed to reflect much of the incident radiant energy. The reflective design can actually be optimized with respect to the specific operating temperature and thermal energy spectrum of a particular component in a gas turbine engine, e.g., turbine blade, transition piece, combustor liner. In one embodiment, the total coating thickness ranges between 50 to 250 microns and, in general, is thinner than conventional thermal barrier coatings. This is a distinct advantage because it reduces the amount of stress in the coating, as well as the weight, and improves aerodynamic efficiency.

The preferred method of application of the nanoscale multilayered ceramic coating is by means of an electron-beam physical vapor deposition process with the temperature of the substrate maintained at a level of 1020° C. or above. Coatings may also be deposited by other physical vapor deposition processes, such as sputtering, however, the temperature of the substrate must be maintained above the prescribed level to ensure the formation of the desired alpha-alumina phase.

BRIEF DESCRIPTION OF THE DRAWINGS

The details of the invention will be described along with the accompanying drawings.

Like reference numerals refer to corresponding parts throughout the drawings.

DETAILED DESCRIPTION OF THE INVENTION

Figure 1:
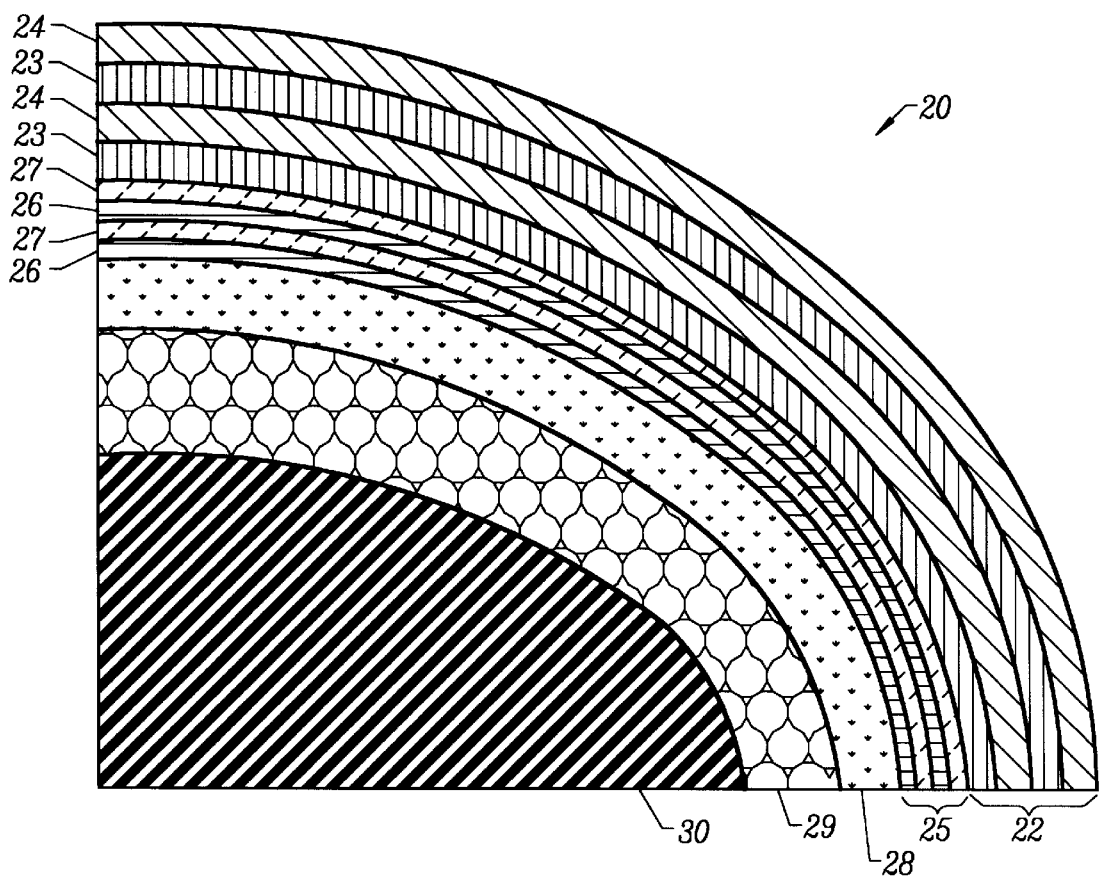
FIG. 1 is a cross-sectional drawing showing the individual layers of an embodiment of the coating of the invention.

FIG. 1 illustrates a thermal barrier coating 20 constructed in accordance with the present invention. The thermal barrier coating 20 is a composite multilayer structure, which includes at least two interrelated zones that perform different functions. An optical reflectance zone 22 includes a stack of ceramic materials that form a set of optically reflecting interface layers. Each optically reflecting interface layer is formed between a first ceramic material 23 and a second ceramic material 24. The first ceramic material 23 may be alumina and the second ceramic material 24 may be zirconia. Alternative materials for the second ceramic material 24 include yttrium-aluminum-garnet (YAG), titania ($TiO_2$), silica ($SiO_2$), and other stabilized forms of zirconia, e.g., Ce—$ZrO_2$.

The thickness of the ceramic material is selected to preferentially reflect incident radiant energy. The preferred design, as shown in Table I, consists of 126 layers, divided into 11 groups, and has a total thickness of 37.8 microns. The physical thickness of the individual layers varies from 0.125 microns to 0.893 microns. Various combinations of the individual groups may also be employed to satisfy the conditions of a particular operating temperature regime. If a thinner coating with less reflectance is desirable, selected groupings may be employed.

TABLE I

Inrared Reflective Thermal Barrier Designs
Substrate: H = $ZrO_2$:2.1; L = $Al_2O_3$:1.6

| Refractive Index | Physical Thickness (nm) | Group No. | Total μm for Group | No. of Pairs per Group |
|---|---|---|---|---|
| H | 125 | | | |
| L | 164 | 1 | 2.60 | 9 |
| H | 150 | | | |
| L | 197 | 2 | 3.12 | 9 |
| H | 185 | | | |
| L | 243 | 3 | 3.85 | 9 |
| H | 225 | | | |
| L | 295 | 4 | 4.16 | 8 |
| H | 260 | | | |
| L | 348 | 5 | 4.25 | 7 |
| H | 325 | | | |
| L | 420 | 6 | 4.47 | 6 |
| H | 335 | | | |
| L | 427 | 7 | 3.81 | 5 |
| H | 400 | | | |

TABLE I-continued

Infrared Reflective Thermal Barrier Designs
Substrate: H = ZrO$_2$:2.1; L = Al$_2$O$_3$:1.6

| Refractive Index | Physical Thickness (nm) | Group No. | Total μm for Group | No. of Pairs per Group |
|---|---|---|---|---|
| L | 532 | 8 | 3.73 | 4 |
| H | 490 | | | |
| L | 663 | 9 | 3.46 | 3 |
| H | 690 | | | |
| L | 893 | 10 | 3.17 | 2 |
| H | 720 | | | |
| L | 466 | 11 | 1.19 | 1 |
| | | Gas Phase | | |
| | | | 37.80 | Total μm |

FIG. 1 also illustrates a phonon scattering zone 25. The phonon scattering zone 25 includes a stack of ceramic materials that form a set of phonon scattering interface layers. Each phonon scattering interface layer is formed between a first ceramic material 26 and a second ceramic material 27. The first ceramic material 26 may be alumina and the second ceramic material 27 may be zirconia. Alternative materials for the second ceramic material 27 include yttrium-aluminum-garnet (YAG), titania (TiO$_2$), silica (SiO$_2$), and other stabilized forms of zirconia, e.g., Ce—ZrO$_2$. In the preferred embodiment, this structure typically consists of 5 nanometer thick layers of yttria-stabilized zirconia (YSZ), and 5 nanometer thick layers of alumina; however, the thicknesses of the individual layers can vary from 1 nanometer to 1,000 nanometers in thickness. Successful embodiments of the invention will use between 100 and 25,000 layers of individual layers in the range specified.

The interface zone between individual layers must be sufficiently sharp to scatter phonons and not be composed of a gradual or graded transition from one layer to the next. The individual layer thicknesses do not have to be precise as long as they remain within the range specified. A structure in which the zirconia layers are thicker, even up to 10 times greater, than the alumina layers may also be used. The latter design will further decrease the composite thermal conductivity of the multilayered structure since YSZ has an intrinsically lower thermal conductivity than alumina.

The thermal barrier coating 20 may also include an oxidation barrier 28. The oxidation barrier may be implemented as 50 to 100 nanometers of pure alumina. The high density aluminum oxide deposit provides a barrier to further oxidation of the underlying metallic substrate and performs essentially the same function as discussed in U.S. Pat. No. 4,880,614. The oxidation barrier 28 may be positioned directly on a superalloy substrate 30 (e.g., a Nickel-based superalloy). Alternately, a bond layer 29 may be used. The bond layer 29 may be Pt—Al or MCrAlY, where M is Fe, Ni or Co. The bond layer is oxidized to form a dense protective alumina layer. Zirconia can be substituted as a transition layer 28.

A major use of the invention coating is in the protection of the superalloy articles used in gas turbine engines. Superalloys are nickel-, cobalt-, and iron-base alloys that have exceptional properties at elevated temperatures and are described in various U.S. patents, including U.S. Pat. Nos. 4,055,705; 4,209,348; 4,582,548; and 4,743,514.

In order to maintain the desired nanostructural features, the coatings should be deposited by physical vapor deposition, and preferably by electron-beam evaporation. A physical vapor deposition configuration is depicted in FIG. 2 for a flat sample specimen, and in FIG. 3 for a specimen that must be rotated around its central axis, e.g., a turbine blade.

Figure 2:
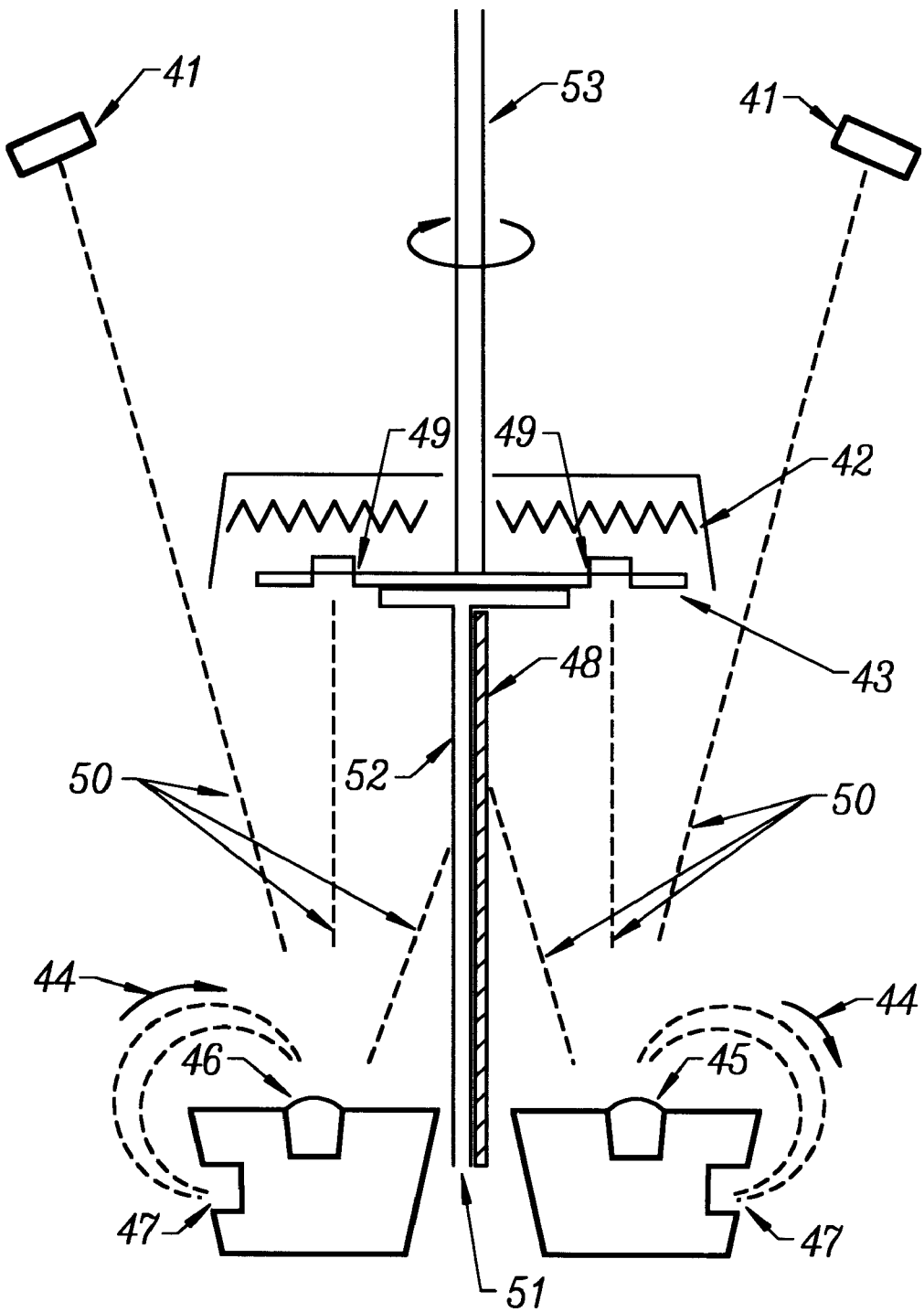
FIG. 2 is a schematic view of a physical vapor deposition apparatus that can be used to deposit the ceramic thermal barrier coating of the invention.

Referring to FIG. 2, the figure illustrates a quartz crystal thickness monitor 41 to measure the thickness of source materials to be deposited. A substrate heater 42 heats a substrate 49 positioned on a rotating substrate holder 43. An electron gun 47 generates an electron beam 44 that is applied to a first source 45, which is usually a zirconia source. An electron gun 47 also generates an electron beam 44 that is applied to a second source 46, which is usually alumina. The electron beam 44 produces an evaporant 50, which condenses on the substrate 49. A dividing barrier 48 is used to separate the two material zones and thereby eliminate cross contamination.

FIG. 2 also shows an oxygen rich gas 51, a bleed tube 52, and a support shaft 53 for the substrate holder 43. FIG. 2 does not illustrate a vacuum chamber or vacuum pump, but their operation will be appreciated by those skilled in the art.

Power to evaporate the ceramic source material is provided by the two high-energy electron-beam guns 47 focused onto the alumina target 46 and the zirconia target 45. The alumina and zirconia vapor produced by evaporation of the target material condenses onto the substrate 49 to form the coating. The rotation speed of the substrate is controlled depending upon the substrate configuration so that the desired thickness layers are deposited when the surface of the specimen is preferentially exposed to one or the other of the vapor sources. As previously mentioned, the dividing barrier 48 separates the two material zones and thereby eliminates cross contamination. Zirconia and alumina deposition rates are typically in the range of 5 to 25 microns per minute. The parts to be coated are heated as the temperature is controlled by various means, such as the substrate heater 42, plus the heat provided by the electron-beam source and the radiant energy from the target material. Component temperature must be maintained at 1020° C. or higher in order to assure that alpha-phase alumina is stable. Lower temperatures will produce a variety of other crystallographic phases that do not maintain their stability at high temperatures, and will eventually transform into alpha. When this happens, the volume changes associated with the transformation introduces stresses that can damage the coating and induce interlayer cracking.

Physical vapor deposited zirconia is often oxygen-deficient due to partial disassociation during evaporation in a vacuum. However, oxygen may be bled into the system and injected into the zirconia vapor flux to minimize any deviations from stoichiometry during coating. While alumina is much less susceptible to disassociation, substoichiometric deposits do occur and the preferred approach is to add oxygen to the alumina vapor cloud as well. This practice helps to assure hard, dense, deposits.

Physical vapor deposition, which includes both sputtering and evaporation processes, is typically a line-of-sight deposition process. Unless the flux of atoms arriving at the deposit surface are disrupted in some predetermined way, the structure which evolves from the deposition process will have segmented or columnar microstructural features. If a structure is optimized, as described in U.S. Pat. No. 4,321,311, the coating is better suited to accommodating mismatches in thermal expansion between the underlying metallic substrate and ceramic overlay coating when exposed to thermal cycling. The optimized structure includes open boundaries between columns and is, therefore, transparent to the ingress of oxygen. As a result, it plays no role in protecting the underlying metallic substrate or intermetallic bond layer.

In the multilayered nanostructured coating described in this invention, the optimized columnar or segmented microstructure is not necessary. The thin nanoscale layers that comprise the coating described in this invention have adequate toughness. The nanoscale layers, together with the normal microstructural features produced by electron-beam physical vapor deposition, are sufficient to provide adequate toughness and good thermal cycle resistance. In addition, the many individual layers of dense alumina provide supplemental protection from the inward permeation of oxygen to the underlying substrate and/or bond layer and greatly enhance the long-term durability of the coating.

Figure 3:
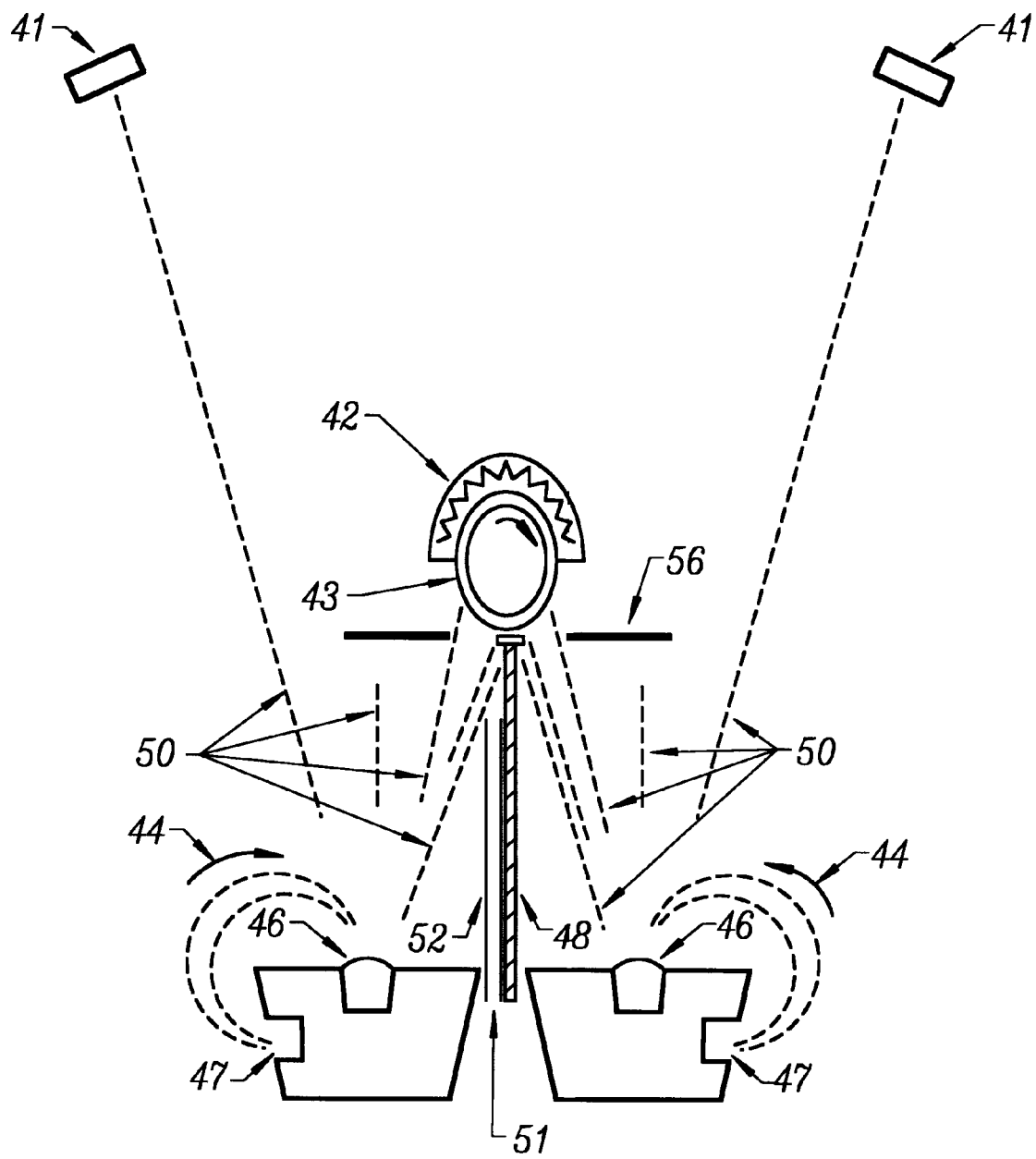
FIG. 3 is a schematic view of an alternate physical vapor deposition apparatus that can be used to deposit the ceramic thermal barrier coating of the invention.

The apparatus of FIG. 3 is used for a specimen that must be rotated around its central axis, e.g., a turbine blade. The operation of the apparatus is analogous to the operation of the apparatus of FIG. 2, with the exception that the apparatus of FIG. 3 includes an additional barrier plate 56, which limits the deposits onto the rotating substrate 43.

The following example illustrates aspects of the invention and should not be taken as a limiting invention in any respect. A 1.27 cm diameter pure niobium disk, approximately 80 microns in thickness, was coated with 670 bilayers consisting of approximately three nanometers of alumina and two nanometers of zirconia to a thickness of 3.4 micrometers. A pure grade of niobium was chosen because the technique used to measure the thermal conductivity of the coating required a substrate with well-known physical properties. The coating apparatus, illustrated in FIG. 2, used a dividing partition 48 to separate the two target sources, and prevented intermingling of the vapor fluxes during vapor deposition.

Dual 14 kW electron-beam evaporation sources 47 were focused on crucibles filled with 99.8% purity alumina rod stock and 7% yttria-stabilized zirconia ingot rod. The niobium test substrates were polished with 600 grit paper, vapor degreased, and cleaned prior to deposition. Approximately 10 nanometers of pure alumina was initially deposited on the metal substrate prior to deposition of the alternating layers. The niobium discs were positioned in slightly oversized holes that were counter-bored in a tantalum plate that was suspended by a central rod at a position of approximately 2" below a quartz lamp heating assembly. This substrate holding fixture was then rotated, as shown in FIG. 2, so that the test disc was alternately passed over the two vapor sources. The sample was rotated at 6.1 rpm, corresponding to a linear velocity of 2.9 meters per minute.

Following deposition of the ceramic thermal barrier coating layer, the coating was over coated with 0.58 microns of niobium by sputtering and sent to the National Institute of Standards and Technology for diffusivity measurements. The thermal conductivity of the ceramic coating was determined from the laser flash technique using the known specific heat of the pure niobium metal substrates, and the measured thermal diffusivity.

The thermal conductivity calculated from the thermal diffusivity measurement of this 670 bilayer coating of 3.4 micrometers in thickness was determined to be 1.1 Wm/° K. This value is approximately 50% of a reference YSZ sample produced by the same EB-PVD coating process consisting of yttria-stabilized zirconia of comparable thickness, but with no multilayer or nanoscale features. The reference sample yielded a thermal conductivity of 2.1 Wm/° K. which agrees closely with the values reported in the literature for YSZ produced by electron-beam evaporation.

The thermal conductivity of the 670 bilayer pairs of alumina and zirconia was approximately ⅓ the expected rule of mixtures calculated from the equivalent amounts of alumina and yttria-stabilized zirconia in the multilayer nanoscale coating plus the alumina bond coat. These results demonstrate a distinct reduction in the thermal conductivity for a ceramic thermal barrier insulative layer that incorporates the nanostructure multilayer coating design features described in this invention. The same order of improvement can be expected from other materials with intrinsically lower thermal conductivities, e.g., ceria-stabilized zirconia. In effect, an equivalent degree of thermal protection can be obtained in a coating with ½ the thickness of a single layer electron-beam evaporated YSZ thermal barrier.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

We claim:

1. A thermal barrier coating, comprising:
   an oxidation barrier (28);
   a phonon scattering zone (25) including a first stack of ceramic materials including a plurality of phonon scattering interface layers, each of which is formed between a first ceramic material (26) and a second ceramic material (27), said first ceramic material (26) and said second ceramic material (27) each being between 1 and 1000 nanometers thick; and
   an optical reflectance zone (22) including a second stack of ceramic materials with a plurality of optically reflecting interface layers, each of which is formed between a first ceramic material (23) and a second ceramic material (24), said first ceramic material (23) and said second ceramic material (24) each being between 0.1 and 1.0 microns thick.

2. The thermal barrier coating of claim 1 wherein said first ceramic material (23, 26) is alumina and said second ceramic material (24, 27) is zirconia.

3. The thermal barrier coating of claim 1 wherein said first ceramic material (26) and said second ceramic material (27) of said phonon scattering zone (25) are each between 2 and 10 nanometers thick.

4. The thermal barrier coating of claim 1 wherein said first ceramic material (26) and said second ceramic material (27) of said phonon scattering zone (25) are each approximately 5 nanometers thick.

5. The thermal barrier coating of claim 2 wherein each zirconia layer in said phonon scattering zone (25) is approximately ten times thicker than each alumina layer in said phonon scattering zone (25).

6. The thermal barrier coating of claim 1 wherein said oxidation barrier (28) is formed of alumina.

7. The thermal barrier coating of claim 1 wherein said first stack of ceramic materials of said phonon scattering zone (25) and said second stack of ceramic materials of said optical reflectance zone (22) comprises between 100 and 25,000 ceramic material layers.

* * * * *